US011105854B2

(12) United States Patent
Pappu et al.

(10) Patent No.: US 11,105,854 B2
(45) Date of Patent: *Aug. 31, 2021

(54) SYSTEM, APPARATUS AND METHOD FOR INTER-DIE FUNCTIONAL TESTING OF AN INTEGRATED CIRCUIT

(71) Applicant: Intel Corporation, Santa Clara, CA (US)

(72) Inventors: Lakshminarayana Pappu, Folsom, CA (US); Robert P. Adler, Santa Clara, CA (US); Ki Yoon, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 791 days.

This patent is subject to a terminal disclaimer.

(21) Appl. No.: 15/801,454

(22) Filed: Nov. 2, 2017

(65) Prior Publication Data

US 2019/0033368 A1    Jan. 31, 2019

(51) Int. Cl.
*G01R 31/3187* (2006.01)
*G01R 31/3185* (2006.01)

(52) U.S. Cl.
CPC . *G01R 31/3187* (2013.01); *G01R 31/318505* (2013.01); *G01R 31/318513* (2013.01)

(58) Field of Classification Search
None
See application file for complete search history.

(56) References Cited

U.S. PATENT DOCUMENTS

| 8,929,373 | B2 | 1/2015 | Lakshmanamurthy et al. |
| 9,436,623 | B2* | 9/2016 | Wertheimer ............ G06F 13/14 |
| 2013/0083798 | A1 | 4/2013 | Lakshmanamurthy et al. |
| 2015/0092779 | A1 | 4/2015 | Lakshmanamurthy et al. |
| 2016/0285434 | A1* | 9/2016 | Menon ................... H01L 22/34 |
| 2017/0184666 | A1 | 6/2017 | Pappu et al. |

OTHER PUBLICATIONS

Intel Corporation, "Product Brief. Intel Go Autonomous Driving Solutions. Autonomous Driving Accelerated," Nov. 2016, 6 pages.
Infineon, "Highly Integrated and Performance Optimized 32-bit Microcontrollers for Automotive and Industrial Applications," Mar. 2017, 62 pages.
U.S. Appl. No. 15/718,178, filed Sep. 28, 2017, entitled "System, Apparatus and Method for Tunneling Validated Security Information," by Ruirui Huang, et al.

(Continued)

*Primary Examiner* — Roy Y Yi
(74) *Attorney, Agent, or Firm* — Trop, Pruner & Hu, P.C.

(57) ABSTRACT

In one embodiment, an apparatus includes multiple die and at least one interconnect to couple the die. A first die includes one or more cores, a first fabric and a first fabric transactor coupled to the first fabric, the first fabric transactor to initiate a functional test of the apparatus in response to a test signal, cause at least one first test transaction to be sent to a second die, receive a first response to the at least one first test transaction from the second die, and identify, based at least in part on the first response to the at least one test transaction, a location of a failure and report the location of the failure to a destination. Other embodiments are described and claimed.

20 Claims, 6 Drawing Sheets

(56) References Cited

OTHER PUBLICATIONS

U.S. Appl. No. 15/391,984, filed Dec. 28, 2016, entitled "Method, Apparatus and System for Handling Non-Posted Memory Write Transactions in a Fabric," by Robert P. Adler, et al.
U.S. Appl. No. 15/338,639, filed Oct. 31, 2016, entitled "Method, Apparatus and System for Automatically Performing End-to-End Channel Mapping for an Interconnect," by Krishnan Srinivasan, et al.
U.S. Appl. No. 15/801,443, filed Nov. 2, 2017, entitled "System, Apparatus and Method for Functional Testing of One or More Fabrics of a Processor," by Lakshminarayana Pappu, et al.

\* cited by examiner

SYSTEM, APPARATUS AND METHOD FOR INTER-DIE FUNCTIONAL TESTING OF AN INTEGRATED CIRCUIT

TECHNICAL FIELD

Embodiments relate to testing of integrated circuits.

BACKGROUND

Integrated circuits (ICs) are the backbone of the modern computer age. Many integrated circuits are implemented in computer systems ranging from server computers, personal computers, mobile devices and so forth. In addition, as technology advances, integrated circuits are becoming incorporated into a further variety of devices including medical devices, vehicles, sensor devices, household appliances and so forth.

Before incorporating a given integrated circuit into an end system, various testing is performed. For example, semiconductor wafers including dies that in turn are incorporated into integrated circuits are tested during manufacturing of the semiconductor wafers. At a conclusion of such testing, additional high volume manufacturing testing during final packaging of an integrated circuit may occur. Still further, an original equipment manufacturer that is to incorporate an IC into a given system may also perform various testing to ensure reliability. Nevertheless, particularly in instances where an integrated circuit includes multiple semiconductor dies, it is difficult if not impossible to isolate the location of a failure within the integrated circuit in current test environments.

DETAILED DESCRIPTION

In various embodiments, techniques are provided to enable functional and debug testing of integrated circuits (ICs) to readily identify specific locations/components that suffer failures, errors and so forth. More specifically, embodiments provide circuitry and control of an IC that enable an original equipment manufacturer (OEM) such as a computing device manufacturer (that is to integrate the IC into a manufactured computing system) to gain visibility as to the actual location of failure within the IC. As such, embodiments provide an OEM-visible solution that works at functional speed and reduces internal high volume manufacturing (HVM) test times.

Although the scope of the present invention is not limited in this regard, embodiments provide mechanisms to identify the location of a problem within one or more particular components of the IC such as a particular die, interconnect, fabric or so forth. In some embodiments, an IC may include multiple semiconductor dies including a computing die (having one or more processor cores and other circuitry) and an accelerator die (having one or more accelerator processing circuits such as graphics processors, media processors, display processors, fabrics and so forth). The IC may further include interconnects, such as an intra-package link to interconnect different dies within an IC package that may be implemented using an embedded interconnect bridge, a stacked-die interconnect or so forth. Embodiments may be used to perform at speed functional testing and debug of integrated circuits including multiple independent semiconductor dies.

Figure 1:
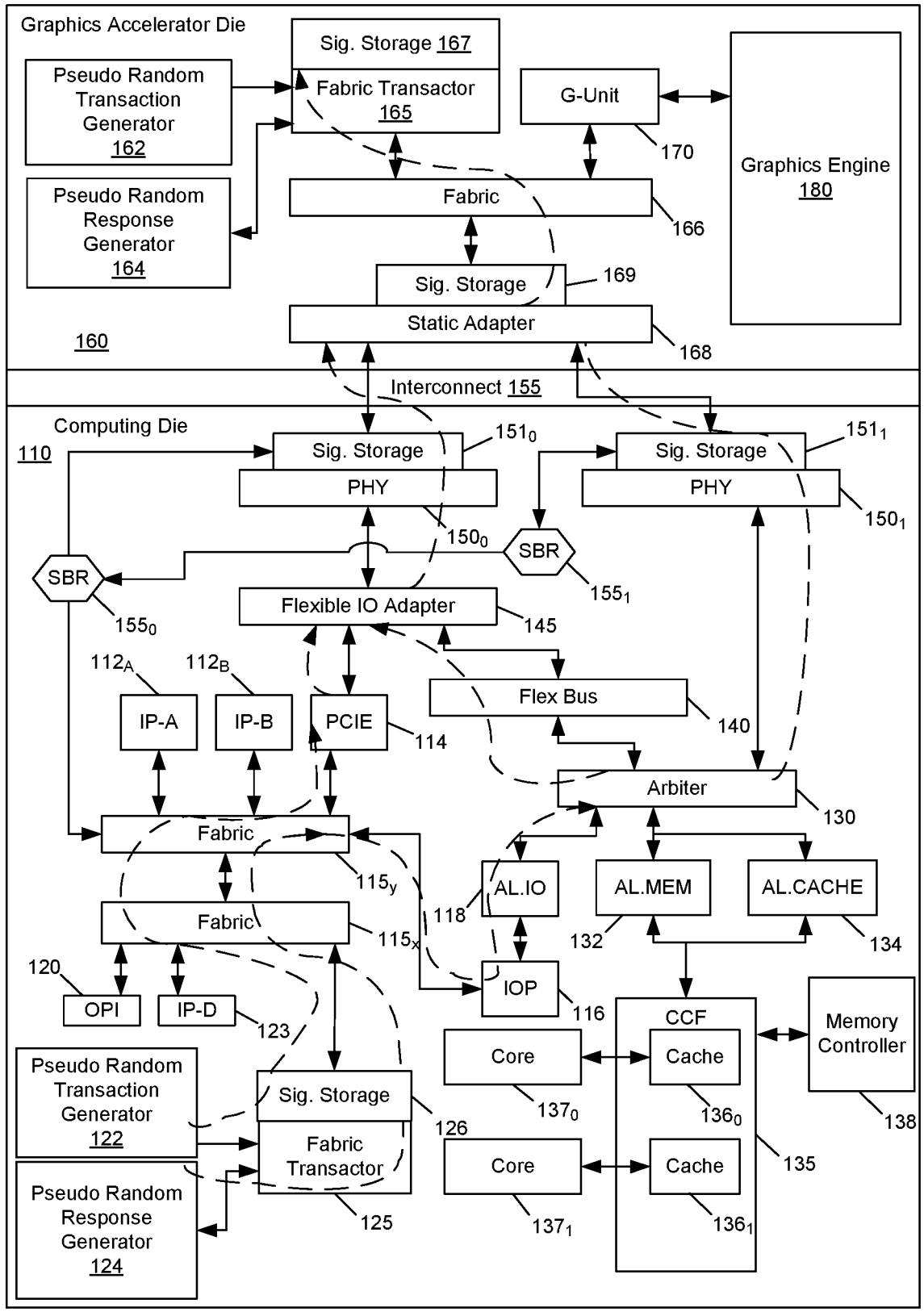
FIG. 1 is a block diagram of a system on a chip (SoC) in accordance with an embodiment.

Referring now to FIG. 1, shown is a block diagram of a system on a chip (SoC) in accordance with an embodiment. More specifically, SoC 100 may be implemented as a multi-die IC package such as a multi-chip module. In embodiments herein, SoC 100 may be configured to perform HVM testing in a manner to identify errors or other defects in manufacturing and functional operation based on this testing. The testing may precisely identify a location of a failure, e.g., as isolated to a particular die, interconnect coupling such die, and/or one or more fabrics within such die.

More specifically as described herein, on-chip testing may be performed by using test transactions generated within SoC 100 itself via on-die transaction generation techniques. The diagnostic testing performed herein may be performed during manufacturing testing of the integrated circuit, e.g., by a semiconductor manufacturer. In other cases, the diagnostic testing may be performed by an OEM that incorporates the SoC within a given computer system, such as during manufacturing testing of such system. In this way, the OEM may identify a location of a failure and forward information and/or a failing IC to a correct vendor. This is particularly so in embodiments in which a multi-die package includes multiple dies, where one or more of the die may be manufactured by an independent manufacturer (namely different from a manufacturer of the overall IC). That is, since embodiments can identify a particular location of a failing component, it is possible to identify a failure of a third party die within the package and thus to direct concerns with regard to this failure to that third party manufacturer, avoiding interaction with the primary semiconductor manufacturer, potentially reducing a time to perform debug or other failure analysis operations.

As seen in FIG. 1, SoC 100 is implemented as a multi-chip package including a first die 110 which as shown is a computing die, and a second die 160 which as shown is a graphics accelerator die. While particular die types are shown for example purposes, understand the scope of the present invention is not limited in this regard and in other embodiments, different types of accelerator die, CPU die or so forth may be present. In addition, in some cases more than two die may be present within a particular package. Still further, understand that in other embodiments, the diagnostic testing techniques described herein may be performed on an integrated circuit having a single die.

With reference to FIG. 1, computing die 110 may be a primary or CPU domain of SoC 100. To this end, computing die 110 may include multiple cores. While two cores 137$_0$, 137$_1$ are illustrated, in other examples more than two such cores may be present. As seen, cores 137 (generically) couple to a cache coherent fabric 135 that in turn also couples to a memory controller 138. In turn, memory controller 138 may communicate with an off-chip memory (not shown in FIG. 1) such as a given system memory. As further illustrated, fabric 135 includes multiple caches 136$_0$, $136_1$. In an embodiment, each cache 136 may be a cache dedicated to a given one of cores 137. In other cases, caches 136 may be implemented as a shared cache memory. In any event, fabric 135 couples to an accelerator memory (AL.memory) 132 and an accelerator cache (AL.cache) 134. Communications in this instance may be via a rich set of protocols that includes I/O semantics similar to PCIe (AL.IO), caching protocol semantics (AL.cache), and memory access semantics (AL.mem) over discrete or on-package links. Depending on the particular accelerator usage model, all of the protocols or a subset of the protocols may be enabled. These interfaces provide a low latency, high bandwidth path for an accelerator to access a system.

In turn, these components couple to an arbiter 130 that acts as an arbitration circuit and an interface with additional components, including a flexible bus 140 and a physical unit circuit (PHY) $150_1$. In an embodiment, arbiter 130 may include a static programmable multiplexer to direct transactions either towards flexible bus 140 (in turn coupled to another PHY $150_0$) or to PHY $150_1$. In an embodiment, PHY 150 may be implemented using an analog set of buffers that transfers PCIe or accelerator protocol data between dies. In one embodiment, these buffers may operate at 8 Giga transfers per second (GT/s). In embodiments herein, PHY $150_1$ may include or be associated with a signature storage $151_1$, which may store a signature generated during the diagnostic testing described herein. In an embodiment, PHY $150_0$ may be implemented as a Peripheral Component Interconnect Express (PCIe) PHY. Note that a similar signature storage $151_0$ may be implemented within or associated with PHY $150_0$. As illustrated, PHY $150_0$ also couples to a flexible input/output (I/O) adapter 145.

Adapter 145 further couples to a PCIe interface 114. In turn, PCIe interface 114 couples to a fabric $115_y$. In an embodiment, fabric 115 may be a primary scalable fabric (PSF) to which various intellectual property (IP) agents such as processor cores, accelerators, fixed function units, security circuits, interfaces, switches, routers, and so forth may couple (generally referred to herein as "IP logics" or "IP blocks"). Note that in an embodiment, PSFs may be integrated on-chip scalable fabrics (IOSFs), which may be designed according to a given specification of a semiconductor manufacturer to provide a standardized on-die interconnect protocol for attaching IP blocks within a chip. For the most part, such IP blocks are not shown in FIG. 1 to avoid obscuring the testing functionality described herein. However certain IP blocks are shown to couple to certain fabrics.

Additional components may couple to fabric $115_y$, including a first IP agent $112_A$ and a second IP agent $112_B$. In different examples, IP agents $112_A$, $112_B$ may be various types of accelerators, fixed function processing units, interfaces, or other types of circuits. As further illustrated, fabric $115_y$ also couples to another fabric 115, which may be implemented as a primary scalable fabric. As seen, fabric $115_x$ couples to another IP block 123 and an on package interface (OPI) 120. OPI is a protocol that communicates with an on-package chipset. This protocol may be used to communicate between CPU die 110 and a peripheral controller hub when packaged together in a multi-chip package.

As further illustrated, to enable test transactions received in fabrics 115 from a fabric transactor 125 to traverse additional pathways within computing die 110, certain test transactions may be sent from fabric $115_y$ to input/output port (IOP) 116. In turn, IOP 116 may direct such transactions to an AL.input/output circuit (AL.IO) 118 that in turn couples to arbiter 130. In an embodiment, IOP 116 may include a control circuit to direct non-coherent transactions towards AL.IO 118.

To perform the diagnostic testing described herein, transactions may be internally generated within SoC 100 itself. To this end, computing die 110 includes a pseudo-random transaction generator 122 and a pseudo-random response generator 124. As seen, these components in turn couple to fabric transactor 125. In one embodiment, fabric transactor 125 may be configured to launch and receive primary test transactions for the testing described herein. More specifically, fabric transactor 125 can launch and receive test transactions via fabric $115_x$. In embodiments, both posted and non-posted transactions may be issued via a source decoding mechanism within fabric transactor 125. In an embodiment, fabric transactor 125 may be configured to initiate sideband transactions via a sideband network of the integrated circuit on test completion to read results from various signature collectors or other storages. In addition, fabric transactor 125 or other circuitry may be configured to analyze results to identify failure location and generate an appropriate test report. In embodiments herein, fabric transactor 125 may include or be associated with a signature storage 126, which may store a signature generated during the diagnostic testing described herein.

As will be described further herein, transaction generator 122 is programmably configured to generate various test transactions, including, for example, PCIe IOSF transactions such as memory, configuration operations and so forth. In an embodiment, transaction generator 122 may be configured to generate pseudo-random data based on one or more seed values. Generator 122 may enable user programmable source, destination and other transaction fields. In some embodiments, transaction generator 122 may store (or be provided with) one or more seeds to generate posted/non-posted/completion transactions. Once a seed is chosen, all fields may be inferred to be deterministic. In embodiments there may be two kinds of data generation, random and pseudo random data generation. In case of random data generation, typically a random seed is generated dynamically and is used to derive data from a logic circuit. In the second method, a pseudo random seed is chosen and given that seed, all the data generation that commences thereafter is deterministic. This technique is referred to as pseudo-random because although the sequence is generated dynamically, the data it generates can be predicted with certainty. Stated another way, if a seed is known, one can predict the sequence of data generation through a known logic circuit. Based on test programming, transaction generator 122 may be configured to select a number of posted transactions, number of non-posted transactions and/or number of completions to issue for a given test, among other parameters such as number of double words of payload with the posted transactions, and number of bytes to request in the non-posted transactions. In turn, pseudo-random response generator 124 is programmably configured to generate, in response to a received test transaction, a response test transaction that it may cause to be directed back to the initiator of the test transaction.

As further illustrated in FIG. 1, computing die 110 further includes a sideband network that may be used to communicate sideband transactions. To this end, computing die 110 may include various sideband routers, representative sideband routers $155_0$-$155_1$ being shown in FIG. 1. To enable collection of test result information, fabric transactor 125 may issue sideband requests to obtain such test result information. In an embodiment, fabric transactor 125 may itself include a sideband router. As an example, fabric transactor 125 may request test result information, e.g., in the form of signature information from signature storages $151_0$, $151_1$ and obtain this signature information via the sideband network through sideband routers $155_0$, $155_1$, potentially among other such sideband routers. Note that although not shown, primary fabrics (e.g., fabrics $115_{x,y}$) may include a sideband interface to couple to a corresponding sideband router (e.g., $155_0$-$155_1$) of a sideband network to enable communication of various sideband information, including error reporting information and other test result information to be provided to fabric transactor 125. In an embodiment, transactions may proceed via this sideband network according to a sideband protocol of the same IOSF specification applicable to the PSFs.

Still with reference to FIG. 1, computing die 110 couples to graphics accelerator die 160 via an interconnect 155. In an embodiment, interconnect 155 may be implemented as an in-package interconnect, such as an embedded interconnect bridge, a hyper-chip technology to couple stacked die or so forth. To enable communication of transactions and other messages between the die, interconnect 150 couples to a static adapter 168. In embodiments herein, static adapter 168 may include or be associated with a signature storage 169 to store signatures obtained during the diagnostic testing. Static adapter 168 in turn couples to a fabric 166 that may be a primary scalable fabric. Fabric 166 in turn couples to a fabric transactor 165 and a graphics unit 170 that couples to a graphics engine 180. Graphics engine 180 may include a graphics die fabric and graphics circuitry, such as one or more graphics processors, as well as a memory for storing graphics information. In embodiments, fabric transactor 165 interfaces with a pseudo-random transaction generator 162 and a pseudo-random response generator 164. These components may be adapted similarly to transaction generator 122 and pseudo-random response generator 124 of computing die 110. Note that fabric transactor 165 includes or is associated with a signature storage 167 that may store signature information obtained during diagnostic testing.

Further with reference to FIG. 1, note the transaction flow of diagnostic testing transactions. More specifically, FIG. 1 shows a flow of diagnostic testing transactions that are initiated in pseudo-random transaction generator 122 of computing die 110. In general, these transactions communicate upstream via fabric transactor 125, fabrics 115 and via multiple paths, e.g., via IOP 116 and PCIe interface 114, eventually proceeding upstream through PHY units 150 and via interconnect 155 to graphics accelerator die 160. In turn, these diagnostic transactions may be provided to pseudo-random response generator 164, which may generate response transactions in response to receipt of these diagnostic transactions.

That is, when a test transaction reaches a destination die, through a special mode it is routed to the corresponding fabric transactor (e.g., fabric transactor 165 of graphics die 160). In turn, a corresponding response generator (e.g., pseudo-random response generator 164) generates a response for a non-posted transaction that is directed back to the source die. Note that transaction signatures may be collected at exit points and entrance points of the source and destination dies (e.g., via signature storages 151 and 169). Understand while shown at this high level in the embodiment of FIG. 1, many variations and alternatives are possible.

Figure 2:
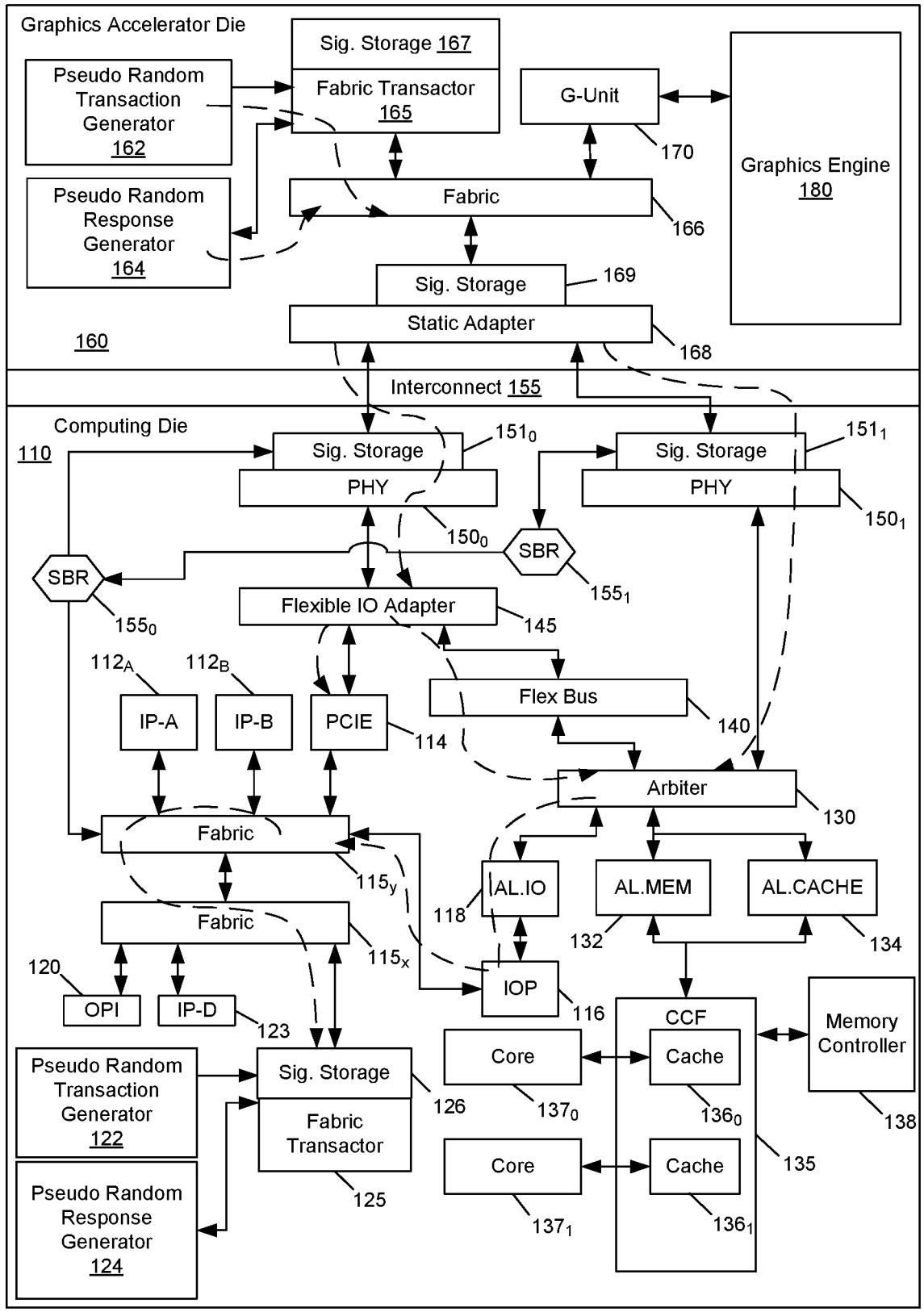
FIG. 2 is another block diagram of an SoC in accordance with an embodiment.

Understand that transactions also may proceed in the opposite direction, namely from graphics die 160 to computing die 110. Such transactions may include responses to the diagnostic transactions originated in computing die 110. In addition, other diagnostic transactions may be initiated within graphics die 160 and be communicated to computing die 110. Referring now to FIG. 2, shown is another block diagram of an SoC in accordance with an embodiment. As illustrated in FIG. 2, SoC 100 is shown, with a transaction flow proceeding from graphics die 160 to computing die 110. In general, flow proceeds in the opposite direction as discussed with regard to FIG. 1. As such, both response transactions (generated in response generator 164) and test transactions (generated in pseudo-random transaction generator 162) may proceed from graphics accelerator die 160 to computing die 110 for eventual provision to fabric transactor 125 (and/or pseudo-random response generator 124).

In an embodiment, the testing described herein may be initiated in response to a command injected through a secured interface (which can be accessed via an external testing device through a TAP controller by writing into a register) by any semiconductor manufacturer during HVM, or an OEM during its testing. In response to test initiation, a transaction generator on a source die injects one or more transactions towards a destination die. The transactions traverse throughout the IC (including die-internal and die-external circuitry), ultimately being directed to a corresponding fabric transactor on the destination die. Based on the specific transaction and testing requested, this destination fabric transactor may store results of such transactions (in an associated signature collector) and possibly send a response transaction in return.

Signature collectors at die entry/exit points may be configured to collect and combine test data into a unique signature. The incoming data may be shifted through a polynomial function (e.g., $f(x)=X^{16}+X^7+X^5+X^3+1$) and the value is stored in a register at the end of the test. With this signature collection, a good signature is distinguishable from a bad one. In one embodiment, a good signature can be computed using perl scripts that are published and provided to test users, such as test personnel of a semiconductor manufacturer and/or OEM. Since the polynomial through which the incoming data walks through is known (mentioned above), one could write a software program to predict the expected value that a signature collector collects at the end of the test. If the data collected on a tested die does not match this expected value, the unit is categorized as a bad unit. If the data matches, the unit is classified as a passing unit.

At a conclusion of the testing, test result information, e.g., in the form of test signatures, can be read out from both the source and destination dies. In turn, these signatures may be compared with an expected result, such as a so-called golden value. When a transaction (posted/non-posted/completion) arrives at signature logic, it traverses through a multiple input signature register (MISR) logic and the resulting data is stored into a register. The polynomial used for the MISR function in one embodiment is as described earlier. This signature loses the granularity of data it processed and encompasses the entire set of transactions it received during the test. However, this signature is guaranteed to be unique for a passing unit as compared to a failing unit. This set of signatures from each of the signature storage blocks from a passing unit (a known golden unit) is compared to every other unit to determine which sub-component in the unit is defective. Based at least in part on this comparison, the integrated circuit may be identified for pass/fail classification. More specifically, the test results may identify, in the case of a failure, the location of such failure, such as isolating a problem to a given die, die-internal link, package interconnect or so forth. With such granular information as to failure location, a test user (such as an OEM) can send problematic parts to a correct vendor (in the case where different vendors supply different die within an integrated circuit package). Furthermore, on-die transaction generation mechanisms as described herein avoid the need for additional test writing overhead.

Figure 3:
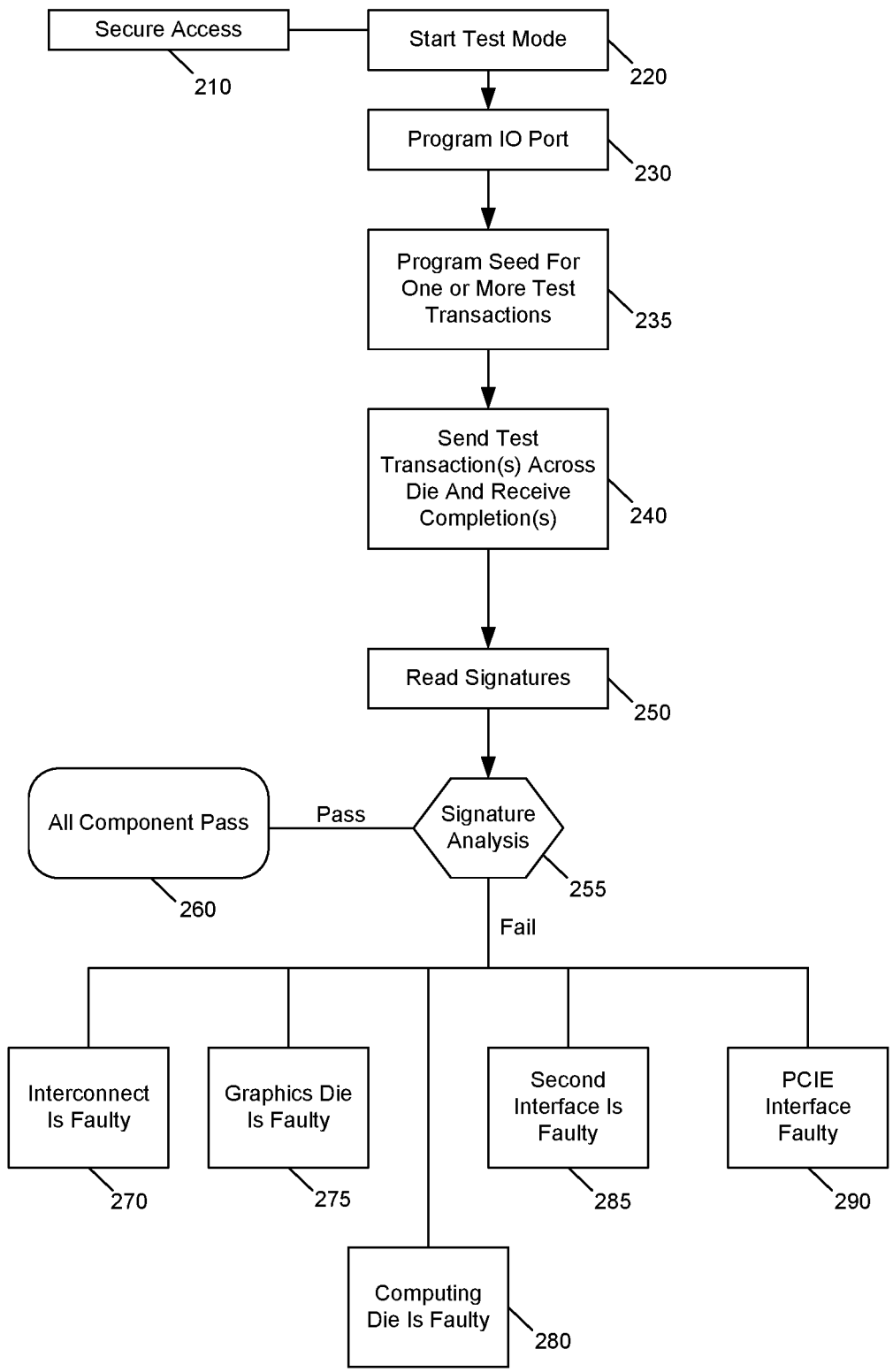
FIG. 3 is a flow diagram of a method in accordance with an embodiment of the present invention.

Referring now to FIG. 3, shown is a flow diagram of a method in accordance with an embodiment of the present invention. As illustrated in FIG. 3, method 200 is a method for performing diagnostic testing as described herein. As such, method 200 may be performed by hardware circuitry, firmware, software and/or combinations thereof, such as programmable control circuitry to perform diagnostic testing during debug, high volume manufacturing or other test situations. As illustrated, method 200 begins by receiving an indication of a secure access (block 210). As an example, an SoC may include a secure test access register that, e.g., when written by a secure agent may initiate the self-testing. In an embodiment, the write may be effected via a secure circuit that writes an encrypted value to this register. In turn, the encrypted value may be decrypted, e.g., using a key, such as provided from a manufacturer of the SoC to an OEM that is to perform the self-testing. Next, control passes to block 220 where the testing may begin by entry into a test mode. A digital key is passed to the SoC and if valid, the SoC allows the external device write into a register to enter the test mode. This bit is part of a secure access control register that is only accessible via a secured access. As discussed, in different cases this testing may be OEM debug testing, HVM testing by a manufacturer of the SoC itself or so forth. Of course in other cases, the testing may be performed by other entities such as a testing facility, e.g., a third party test facility.

Still with reference to FIG. 3, control next passes to block 230 where an I/O port may be programmed. More specifically, this port may be programmed to provide direct transactions to an IA.I/O path, e.g., a given non-coherent path. In test operation, testing components like fabric transactors, pseudo random transaction generators, response generators, signal storage blocks are activated. Instead of the functional transactions across the blocks, testing blocks communicate and receive priority on the fabric. Next, control passes to block 235 where a seed may be programmed for fabric test transactions. In an embodiment, this seed may be received within test code of the HVM test. In any case, this seed may be provided to a pseudo-random number generator to enable the generator to generate one or more test transactions, such as posted and/or non-posted transactions based on this seed.

Still with reference to FIG. 3, next at block 240 these transactions may be communicated and response information in response to these transactions may be received. More specifically, these transactions may be communicated from an originator die to a receiver die via an intra-package link. Assume the case of a non-posted transaction that is provided from the initiator die to the receiver die. In response to receipt of this transaction, the receiver die may in turn generate a completion for the transaction and send it back to the initiator die. More specifically, the destination of this completion transaction may be a fabric transactor as described herein. Next at block 250 the signatures may be read. In an embodiment, this signature information may be communicated, e.g., via a sideband network of the SoC. At diamond 255, the fabric transactor may analyze this signature information. As an example, the transactor may compare this received signature to an expected signature. In one embodiment, this signature may be implemented as a golden signature, which corresponds to a stored signature, e.g., as provided as part of the diagnostic testing setup. This golden signature indicates an expected result based on the programmed seed. If the signatures match, control passes to block 260 where the test results may be reported to a destination as passing and the various components of the SoC, including the multiple die, interconnects, interfaces, fabrics and so forth all are in correct functional execution.

Otherwise if a mismatch or other failure indication occurs, the location of the fault may be identified. In embodiments, this identification may be based on the received signature itself as compared to the golden signature to identify a location of the failure. As such, control may pass to a given one of blocks 270, 275, 280, 285 and 290 to identify a particular die and/or component that failed the self test. There are signature collectors at various junctures in the test apparatus. Based on which signature collector does not match with the golden value, using a simple algorithm one could deduce the bad component. As an example with respect to FIG. 2, if signature collector $151_0$ matches the golden signature value but not the signature collector 169, then interconnect component 155 is defective. Similarly if all signature collectors on computing die 110 match corresponding golden values, but not the signature collectors on the graphics accelerator die 160 do not, one could deduce that graphics accelerator die 160 is defective. As such using an embodiment, diagnostic testing may be performed in a secure and concise manner. Furthermore, information regarding particular components or entities within an SoC that failed can be identified. As such, embodiments provide for improved diagnostic testing, whether performed by a processor manufacturer, OEM or other entity, reducing debug and testing cycles.

Figure 4:
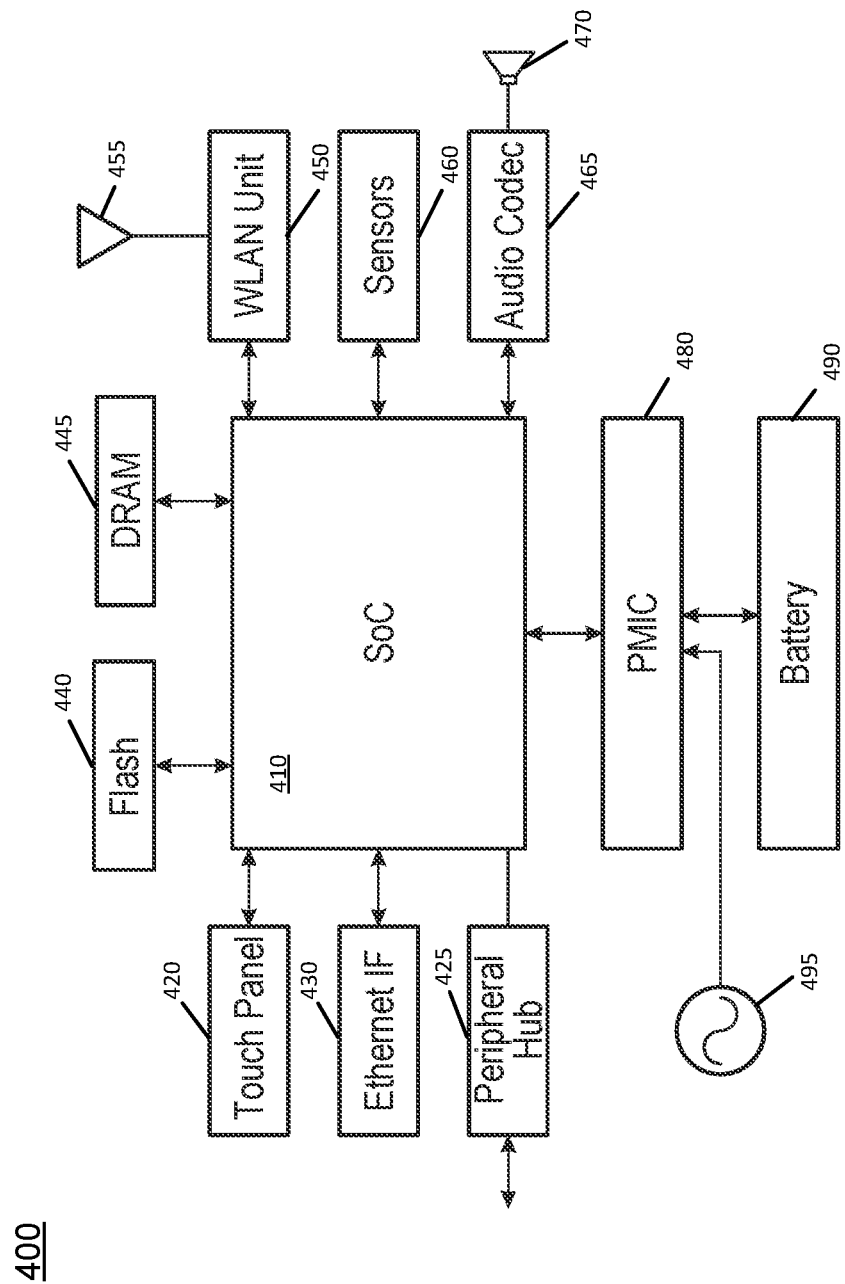
FIG. 4 is a block diagram of an example system with which embodiments may be used.

Functional debug testing as described herein may be implemented in processors to be included in a wide variety of system types, ranging from small portable devices to larger more compute complex devices. Referring now to FIG. 4, shown is a block diagram of an example system with which embodiments may be used. In the illustration of FIG. 4, system 400 may be a mobile system such as a tablet computer, 2:1 tablet, phablet, in-vehicle system, or other system. As illustrated, a SoC 410 is present and may be configured to operate as an application processor for the device. SoC 410 may include, in an embodiment, multiple die having various agents and fabrics that can be tested to identify failure locations as described herein.

A variety of devices may couple to SoC 410. In the illustration shown, a memory subsystem includes a flash memory 440 and a DRAM 445 coupled to SoC 410. In addition, a touch panel 420 is coupled to the SoC 410 to provide display capability and user input via touch, including provision of a virtual keyboard on a display of touch panel 420. To provide wired network connectivity, SoC 410 couples to an Ethernet interface 430. A peripheral hub 425 is coupled to SoC 410 to enable interfacing with various peripheral devices, such as may be coupled to system 400 by any of various ports or other connectors.

In addition to internal power management circuitry and functionality within SoC 410, a PMIC 480 is coupled to SoC 410 to provide platform-based power management, e.g., based on whether the system is powered by a battery 490 or AC power via an AC adapter 495. In addition to this power source-based power management, PMIC 480 may further perform platform power management activities based on environmental and usage conditions. Still further, PMIC 480 may communicate control and status information to SoC 410 to cause various power management actions within SoC 410.

Still referring to FIG. 4, to provide for wireless capabilities, a WLAN unit 450 is coupled to SoC 410 and in turn to an antenna 455. In various implementations, WLAN unit 450 may provide for communication according to one or more wireless protocols. As further illustrated, a plurality of sensors 460 may couple to SoC 410. These sensors may include various accelerometer, environmental and other sensors, including user gesture sensors. Finally, an audio codec 465 is coupled to SoC 410 to provide an interface to an audio output device 470. Of course understand that while shown with this particular implementation in FIG. 4, many variations and alternatives are possible.

Figure 5:
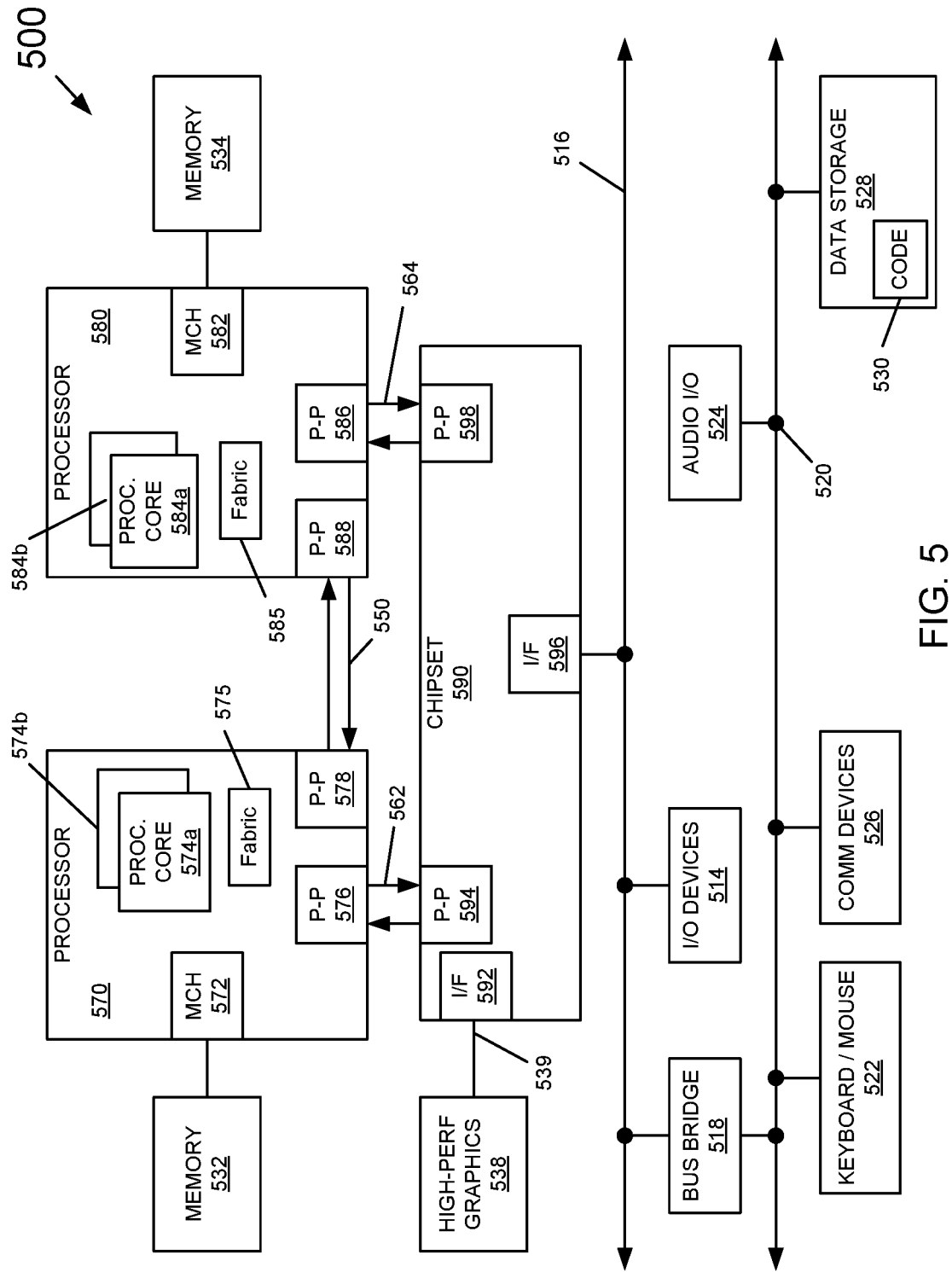
FIG. 5 is a block diagram of a system in accordance with an embodiment of the present invention.

Referring now to FIG. 5, shown is a block diagram of a system in accordance with an embodiment of the present invention. As shown in FIG. 5, multiprocessor system 500 is a point-to-point interconnect system, and includes a first processor 570 and a second processor 580 coupled via a point-to-point interconnect 550. As shown in FIG. 5, each of processors 570 and 580 may be multicore processors, including first and second processor cores (i.e., processor cores 574*a* and 574*b* and processor cores 584*a* and 584*b*), although potentially many more cores may be present in the processors. Each of the processors can include a fabric (575, 585) or other interconnect circuit on which functional debug testing may be performed as described herein to identify locations of failing components.

Still referring to FIG. 5, first processor 570 further includes a memory controller hub (MCH) 572 and point-to-point (P-P) interfaces 576 and 578. Similarly, second processor 580 includes a MCH 582 and P-P interfaces 586 and 588. As shown in FIG. 5, MCH's 572 and 582 couple the processors to respective memories, namely a memory 532 and a memory 534, which may be portions of system memory (e.g., DRAM) locally attached to the respective processors. First processor 570 and second processor 580 may be coupled to a chipset 590 via P-P interconnects 562 and 564, respectively. As shown in FIG. 5, chipset 590 includes P-P interfaces 594 and 598.

Furthermore, chipset 590 includes an interface 592 to couple chipset 590 with a high performance graphics engine 538, by a P-P interconnect 539. In turn, chipset 590 may be coupled to a first bus 516 via an interface 596. As shown in FIG. 5, various input/output (I/O) devices 514 may be coupled to first bus 516, along with a bus bridge 518 which couples first bus 516 to a second bus 520. Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520. Embodiments can be incorporated into other types of systems including mobile devices such as a smart cellular telephone, tablet computer, netbook, Ultrabook™, or so forth.

Figure 6:
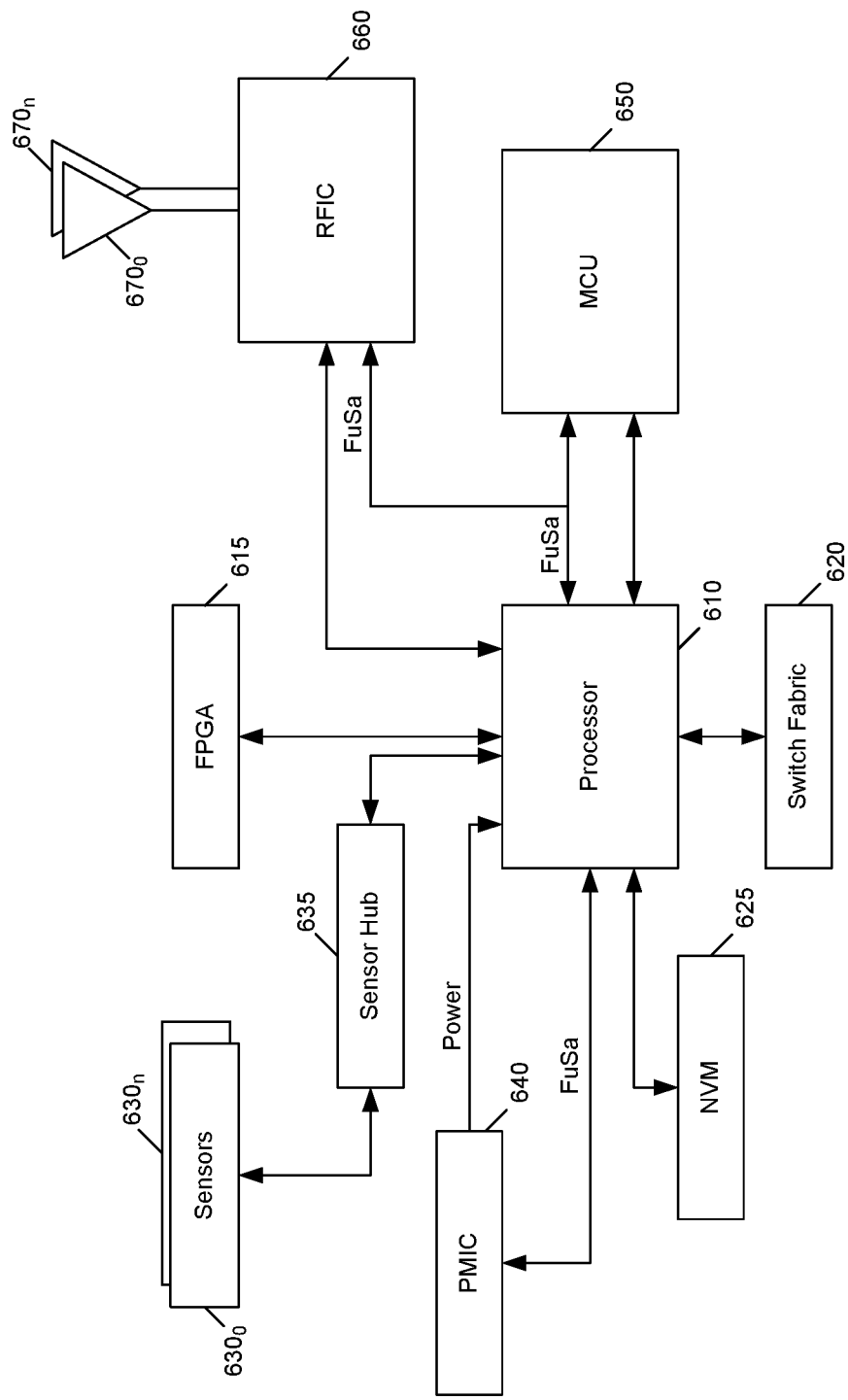
FIG. 6 is a block diagram of a system in accordance with another embodiment of the present invention

Referring now to FIG. 6, shown is a block diagram of a system in accordance with another embodiment of the present invention. In the embodiment of FIG. 6, system 600 is an autonomous driving computing system. As such, system 600 may be implemented within a vehicle that provides for some level of autonomous driving. Understand that with different levels of autonomous driving control, different levels of workloads may be executed within system 600 to autonomously perform some or all driving tasks autonomously. Functional and debug tests may be performed on processor 610 to isolate failure locations to a given die in implementations having multiple dies.

As illustrated, system 600 includes a processor 610, which may be a general-purpose multicore processor or other SoC. In different implementations, multiple such processors may be implemented to flexibly allocate autonomous driving workloads across these processors. Processor 610 receives power that is controlled by a power management integrated circuit (PMIC) 640. As further illustrated, functional safety testing as described herein, both within processor 610 and PMIC 640 may occur, with results communicated between these components.

System 600 may further include one or more field programmable gate arrays (FPGAs) 615 or other programmable accelerators to which certain autonomous driving workloads may be offloaded. Processor 610 further couples to a non-volatile memory 625, which in an embodiment may be implemented as a flash memory. To provide communication with other components within a vehicle, processor 610 further couples to a switch fabric 620 which in an embodiment may be implemented as an Ethernet switch fabric that in turn may couple to other components within a vehicle, including display components, vehicle infotainment systems, and so forth. Still further, processor 610 (and switch fabric 620) also couples to a microcontroller 650 which also may be involved in the functional safety testing.

Furthermore, to enable interaction with other systems, including other vehicles, roadway systems, over-the-air update sources, infotainment content sources, sensor data communication and so forth, processor 610 and MCU 650 may couple to one or more radio frequency integrated circuits (RFICs) 660. In embodiments, RFIC 660 may be configured to support 5G-based specifications for communication of automotive and other data via a variety of wireless networks. To this end, RFIC 660 may couple to one or more antennas $670_0$-$670_n$ of a vehicle.

As further illustrated in FIG. 6, system 600 may include a plurality of sensors $630_0$-$630_n$ that provide sensor information, via a sensor hub 635 to processor 610. Although the scope of the present invention is not limited in this regard, in embodiments such sensors may include lidar, ultrasound, radar and optical sensors, among other sensor types. Such sensors may obtain large amounts of sensor data while the vehicle is in operation. Sensor hub 635 may be configured to fuse at least some of this data to provide information regarding the vehicle's surroundings, for provision to processor 610. In turn, processor 610 and/or FPGA 615 may use this fused sensor information in connection with performing autonomous driving workloads. Understand while shown at this high level in the embodiment of FIG. 6, many variations and alternatives are possible.

The following examples pertain to further embodiments.

In one example, an apparatus comprises: a first die including one or more cores, a first fabric and a first fabric transactor coupled to the first fabric, the first fabric transactor to initiate a functional test of the apparatus in response to a test signal, cause at least one first test transaction to be sent to a second die, receive a first response to the at least one first test transaction from the second die, and identify, based at least in part on the first response to the at least one test transaction, a location of a failure and report the location of the failure to a destination; the second die including at least one graphics engine, a second fabric, and a second fabric transactor; and an interconnect to couple the first die and the second die.

In an example, the first die further comprises a first transaction generator coupled to the first fabric transactor, to generate the at least one first test transaction based on a seed value and provide the at least one first test transaction to the first fabric transactor.

In an example, the apparatus further comprises a first response generator coupled to the first fabric transactor to generate a second response to a second test transaction received from the second die and provide the second response to the first fabric transactor, to enable the first fabric transactor to send the second response to the second die.

In an example, the apparatus further comprises an arbiter to receive a plurality of test transactions from the first fabric transactor, direct a first portion of the plurality of test transactions to the second die via a first physical circuit of the first die, and direct a second portion of the plurality of test transactions to the second die via a second physical circuit of the first die.

In an example, the apparatus further comprises a first signature storage coupled to the first physical circuit to store a first signature comprising at least the first response to the at least one test transaction.

In an example, the first fabric transactor is to obtain the first signature and determine a status of one or more of the first die and the second die based at least in part on the first signature.

In an example, the first fabric transactor is to compare the first signature to a predetermined signature and identify a failure in at least one of the first die and the second die based on the comparison.

In an example, the apparatus further comprises a first sideband router coupled to the first fabric, where the first sideband router is to receive a request from the first fabric transactor for test result information and in response to the request, provide the test result information to the first fabric transactor.

In an example, the first fabric transactor includes a second sideband router to send the request to the sideband router and receive the test result information.

In an example, the first die comprises a compute die of a first vendor and the second die comprises an accelerator die of a second vendor, the apparatus comprising an integrated circuit package of the first vendor and including the first die and the second die.

In another example, a method comprises: receiving a test signal in a fabric transactor of a first die of a SoC; in response to the test signal, generating, in a transaction generator coupled to the fabric transactor, one or more test transactions based on a seed value; sending the one or more test transactions via one or more fabrics of the first die to a second die of the SoC, the second die coupled to the first die via a package interconnect, to test functionality of the SoC; requesting signature information based on the one or more test transactions via a sideband network coupled between the fabric transactor and the one or more fabrics; processing the signature information to identify whether a failure occurred in the SoC during the test; and in response to identifying the failure, determining a location of the failure and communicating an identification of the location of the failure to a destination, the location identification comprising the identification of at least one of the first die, the second die and the package interconnect.

In an example, the method further comprises generating a first test transaction of the one or more test transactions comprising a posted transaction to write test pattern information to a first storage of the second die.

In an example, the method further comprises generating a second test transaction of the one or more test transactions comprising a non-posted transaction to read the test pattern information from the first storage of the second die.

In an example, the method further comprises receiving a completion transaction from the second die comprising the test pattern information in response to the non-posted transaction.

In an example, the method further comprises: obtaining, in the fabric transactor of the first die, the signature information from one or more signatures storages of the first die and one or more signature storages of the second die; and comparing the signature information to a predetermined signature.

In an example, the method further comprises determining the first die to be the location of the failure in response to a miscomparison between a first portion of the signature information associated with the first die and a first portion of the predetermined signature associated with the first die.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In a yet further example, a system comprises a SoC and a non-volatile memory coupled to the SoC. The SoC may comprise first and second die. The first die may include: one or more cores; a first primary fabric coupled to the one or more cores; a first physical circuit coupled to the first primary fabric to communicate with a second die, the first physical circuit associated with a first signature storage; a first fabric transactor coupled to the first primary fabric, the first fabric transactor to initiate a functional test of the SoC in response to a test signal; and a first transaction generator coupled to the first fabric transactor, the first transaction generator to generate at least one first test transaction based on a seed value. The second die may include: one or more accelerators; a second primary fabric coupled to the one or more accelerators; a second physical circuit coupled to the second primary fabric to communicate with the first die, the second physical circuit associated with a second signature storage; and a second response generator coupled to the second physical circuit, the second response generator to generate at least one first response based on the at least one first test transaction, where the first fabric transactor is to obtain signature information from one or more of the first signature storage and the second signature storage and identify, based at least in part thereon, a location of a failure within the SoC and report the location of the failure. The SoC may further include an interconnect to couple the first die and the second die.

In an example, the first die further comprises a first response generator coupled to the first fabric transactor to generate at least one second response to at least one second test transaction received from the second die and provide the at least one second response to the first fabric transactor, to enable the first fabric transactor to send the at least one second response to the second die.

In an example, the first fabric transactor is to obtain first signature information from the first signature storage and second signature information from the second signature storage and determine a status of one or more of the first die and the second die based at least in part on the first signature and the second signature.

In an example, the first die further comprises a first sideband router coupled to the first primary fabric, where the first sideband router is to receive a request from the first fabric transactor for test result information and in response to the request, provide the test result information from one or more of the first signature storage and the second signature storage to the first fabric transactor.

In a still further example, an apparatus comprises: a first die comprising one or more core means, a first fabric means and a first fabric transactor means coupled to the first fabric means, the first fabric transactor means for initiating a functional test of the apparatus in response to a test signal, causing at least one first test transaction to be sent to a second die, receiving a first response to the at least one first test transaction from the second die, identifying, based at least in part on the first response to the at least one test transaction, a location of a failure and reporting the location of the failure to a destination; the second die comprising at least one graphics means, a second fabric means, and a second fabric transactor means; and an interconnect means for coupling the first die and the second die.

In an example, the first die further comprises a first transaction generator means coupled to the first fabric transactor means for generating the at least one first test transaction based on a seed value and providing the at least one first test transaction to the first fabric transactor means.

In an example, the apparatus further comprises a first response generator means coupled to the first fabric transactor means for generating a second response to a second test transaction received from the second die and providing the second response to the first fabric transactor means for enabling the first fabric transactor means for sending the second response to the second die.

In an example, the apparatus further comprises arbiter means for receiving a plurality of test transactions from the first fabric transactor means, directing a first portion of the plurality of test transactions to the second die via a first physical circuit of the first die, and directing a second portion of the plurality of test transactions to the second die via a second physical circuit of the first die.

In an example, the apparatus further comprises a first signature storage means coupled to the first physical circuit for storing a first signature comprising at least the first response to the at least one test transaction.

In an example, the first fabric transactor means for obtaining the first signature and determining a status of one or more of the first die and the second die based at least in part on the first signature.

In an example, the first fabric transactor means for comparing the first signature to a predetermined signature and identifying a failure in at least one of the first die and the second die based on the comparison.

In an example, the apparatus further comprises a first sideband router means for receiving a request from the first fabric transactor means for test result information and in response to the request, providing the test result information to the first fabric transactor means.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first die including one or more cores, a first fabric and a first fabric transactor coupled to the first fabric, the first fabric transactor to initiate a functional test of the apparatus in response to a test signal, cause at least one first test transaction to be sent to a second die, receive a first response to the at least one first test transaction from the second die, and identify, based at least in part on the first response to the at least one test transaction, a location of a failure and report the location of the failure to a destination;
the second die including at least one graphics engine, a second fabric, and a second fabric transactor; and
an interconnect to couple the first die and the second die.

2. The apparatus of claim 1, wherein the first die further comprises a first transaction generator coupled to the first fabric transactor, to generate the at least one first test transaction based on a seed value and provide the at least one first test transaction to the first fabric transactor.

3. The apparatus of claim 2, further comprising a first response generator coupled to the first fabric transactor to generate a second response to a second test transaction received from the second die and provide the second response to the first fabric transactor, to enable the first fabric transactor to send the second response to the second die.

4. The apparatus of claim 1, further comprising an arbiter to receive a plurality of test transactions from the first fabric transactor, direct a first portion of the plurality of test transactions to the second die via a first physical circuit of the first die, and direct a second portion of the plurality of test transactions to the second die via a second physical circuit of the first die.

5. The apparatus of claim 4, further comprising a first signature storage coupled to the first physical circuit to store a first signature comprising at least the first response to the at least one test transaction.

6. The apparatus of claim 5, wherein the first fabric transactor is to obtain the first signature and determine a status of one or more of the first die and the second die based at least in part on the first signature.

7. The apparatus of claim 6, wherein the first fabric transactor is to compare the first signature to a predetermined signature and identify a failure in at least one of the first die and the second die based on the comparison.

8. The apparatus of claim 1, further comprising a first sideband router coupled to the first fabric, wherein the first sideband router is to receive a request from the first fabric transactor for test result information and in response to the request, provide the test result information to the first fabric transactor.

9. The apparatus of claim 8, wherein the first fabric transactor includes a second sideband router to send the request to the sideband router and receive the test result information.

10. The apparatus of claim 1, wherein the first die comprises a compute die of a first vendor and the second die comprises an accelerator die of a second vendor, the apparatus comprising an integrated circuit package of the first vendor and including the first die and the second die.

11. A machine-readable medium having stored thereon instructions, which if performed by a machine cause the machine to perform a method comprising:
receiving a test signal in a fabric transactor of a first die of a system on chip (SoC);
in response to the test signal, generating, in a transaction generator coupled to the fabric transactor, one or more test transactions based on a seed value;
sending the one or more test transactions via one or more fabrics of the first die to a second die of the SoC, the second die coupled to the first die via a package interconnect, to test functionality of the SoC;
requesting signature information based on the one or more test transactions via a sideband network coupled between the fabric transactor and the one or more fabrics;
processing the signature information to identify whether a failure occurred in the SoC during the test; and
in response to identifying the failure, determining a location of the failure and communicating an identification of the location of the failure to a destination, the location identification comprising the identification of at least one of the first die, the second die and the package interconnect.

12. The machine-readable medium of claim 11, wherein the method further comprises generating a first test transaction of the one or more test transactions comprising a posted transaction to write test pattern information to a first storage of the second die.

13. The machine-readable medium of claim 12, wherein the method further comprises generating a second test transaction of the one or more test transactions comprising a non-posted transaction to read the test pattern information from the first storage of the second die.

14. The machine-readable medium of claim 13, wherein the method further comprises receiving a completion transaction from the second die comprising the test pattern information in response to the non-posted transaction.

15. The machine-readable medium of claim 11, wherein the method further comprises:
obtaining, in the fabric transactor of the first die, the signature information from one or more signatures storages of the first die and one or more signature storages of the second die; and
comparing the signature information to a predetermined signature.

16. The machine-readable medium of claim 15, wherein the method further comprises determining the first die to be the location of the failure in response to a miscomparison between a first portion of the signature information associated with the first die and a first portion of the predetermined signature associated with the first die.

17. A system comprising:
a system on chip (SoC), the SoC comprising:
a first die including:
one or more cores;
a first primary fabric coupled to the one or more cores;
a first physical circuit coupled to the first primary fabric to communicate with a second die, the first physical circuit associated with a first signature storage;
a first fabric transactor coupled to the first primary fabric, the first fabric transactor to initiate a functional test of the SoC in response to a test signal; and
a first transaction generator coupled to the first fabric transactor, the first transaction generator to generate at least one first test transaction based on a seed value;
a second die including:
one or more accelerators;
a second primary fabric coupled to the one or more accelerators;
a second physical circuit coupled to the second primary fabric to communicate with the first die, the second physical circuit associated with a second signature storage; and
a second response generator coupled to the second physical circuit, the second response generator to generate at least one first response based on the at least one first test transaction, wherein the first fabric transactor is to obtain signature information from one or more of the first signature storage and the second signature storage and identify, based at least in part thereon, a location of a failure within the SoC and report the location of the failure; and
an interconnect to couple the first die and the second die; and
a non-volatile memory coupled to the SoC.

18. The system of claim 17, wherein the first die further comprises a first response generator coupled to the first fabric transactor to generate at least one second response to at least one second test transaction received from the second die and provide the at least one second response to the first fabric transactor, to enable the first fabric transactor to send the at least one second response to the second die.

19. The system of claim 17, wherein the first fabric transactor is to obtain first signature information from the first signature storage and second signature information from the second signature storage and determine a status of one or more of the first die and the second die based at least in part on the first signature information and the second signature information.

20. The system of claim 17, wherein the first die further comprises a first sideband router coupled to the first primary fabric, wherein the first sideband router is to receive a request from the first fabric transactor for test result information and in response to the request, provide the test result information from one or more of the first signature storage and the second signature storage to the first fabric transactor.

* * * * *